United States Patent
Ressler et al.

(10) Patent No.: US 6,191,048 B1
(45) Date of Patent: *Feb. 20, 2001

(54) PROCESS FOR MANUFACTURING COMPOSITE GLASS/SI SUBSTRATES FOR MICROWAVE INTEGRATED CIRCUIT FABRICATION

(75) Inventors: Kevin Glenn Ressler, Arlington; Jim-Yong Chi, Lexington, both of MA (US)

(73) Assignee: The Whitaker Corporation, Wilmington, DE (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/001,828

(22) Filed: Dec. 31, 1997

(51) Int. Cl.[7] .................................................. H01L 21/31

(52) U.S. Cl. .................. 438/758; 438/620; 438/626; 438/631; 438/637; 438/672; 438/782

(58) Field of Search ................................. 438/758, 620, 438/626, 631, 637, 672, 782

(56) References Cited

U.S. PATENT DOCUMENTS

| | | | |
|---|---|---|---|
| 4,767,672 | * 8/1988 | Fujinaka et al. | 428/446 |
| 4,924,353 | * 5/1990 | Patraw | 361/400 |
| 5,102,822 | 4/1992 | Calligaro | 437/67 |
| 5,268,310 | 12/1993 | Goodrich et al. | 437/15 |
| 5,632,942 | * 5/1997 | Yeh et al. | 156/89 |
| 5,639,325 | 6/1997 | Stevens et al. | 427/96 |
| 5,696,466 | 12/1997 | Li | 330/286 |

FOREIGN PATENT DOCUMENTS

| | | |
|---|---|---|
| 0 342 094 | 11/1989 | (EP) . |
| 0 534 271 A2 | 3/1993 | (EP) . |
| 0 592 002 | 4/1994 | (EP) . |
| WO 97/35340 | 3/1997 | (WO) . |

OTHER PUBLICATIONS

"Glass Microwave IC Packaging Technology", Publication Date, Oct. 5, 1994, Presented by Richard Perko, M/A–COM Inc., Electro International 1994, Hynes Convention Center, Boston, MA, May 10–12, 1994, pp. 857–862.

A New Technology For Si Microwave Power Transistor Manufacturing, XP–002053834, Ping Li, Corp. R&D Center, M/A–COM, Inc. Lowell, MA 01853, Timothy Boles, Burlington Semiconductor Operation M/A–COM Inc., Burlington, MA 01803, pp. 103–106.

International Search Report, Applicant's Reference 16573 PCT, International Application No. PCT/US 97/03468, International Filing Date, Mar. 17, 1997.

U.S. application No. 08/640,290, filed Jul. 22, 1996, Docket No. 16422, Entitled: "Process For Reducing Bond Resistance In Semiconductor Devices And Circuits".

* cited by examiner

*Primary Examiner*—David Nelms
*Assistant Examiner*—Reneé R. Berry

(57) ABSTRACT

A method of forming a glass layer on a substrate of material, for example, silicon, with the glass layer having a coefficient of thermal expansion which substantially matches the substrate. A slurry comprising glass powder and a solvent is applied to the substrate, as for example, by pouring, and a multi-step heating process is carried out with over-pressures of a highly diffusive gas such as hydrogen first, followed by a non-diffusive gas such as nitrogen to thereby create a glass layer having reduced bubbles and fewer bubbles than has heretofore been achieved.

16 Claims, 5 Drawing Sheets

PROCESS FOR MANUFACTURING COMPOSITE GLASS/SI SUBSTRATES FOR MICROWAVE INTEGRATED CIRCUIT FABRICATION

GOVERNMENT RIGHTS

This invention was made with Government support under Agreement No. F33615-94-2-1524 awarded by the United States Air Force, Wright Laboratory. The Government has certain rights in the invention.

FIELD OF THE INVENTION

The present invention relates generally to a process for forming a relatively thick electronics grade glass layer on a semiconductor substrate for use in electronic components, such as printed circuit boards, although other utilities are contemplated, to include the fabrication of semiconductor and microwave devices and multichip modules. The present invention is related to U.S. patent application Ser. No. 09/001,950. (The Whitaker Corporation), filed on even date herewith, the disclosure of which is specifically incorporated herein by reference.

BACKGROUND OF THE INVENTION

Printed circuit boards (PCBs) are used extensively in the electronics arts to mount and interconnect discrete electronic components (integrated circuit chips, etc.) to implement a specific function. Commonly, the board substrate is made of polymers and ceramics, although other materials, such as silicon or other semiconductors can be used. It is often desirable to electrically isolate certain components mounted on the PCB from each other and from the board substrate. Typically, this is accomplished by applying one or more layers of dielectric material to the surface of the board and then mounting the components on or in the dielectric layers. For high frequency electronic applications, thick dielectric layers over conductive substrates are needed for form transmission lines.

Common techniques for forming dielectric layers on a wafer of silicon include chemical vapor deposition (CVD) and spin-on-glass (SOG) techniques. These processes are essentially limited to producing dielectric layers of only several microns in thickness, due to inability to effectively prevent cracking in layers of greater thickness and/or their prohibitively slow formation rates. Because of the limitations of thickness of the dielectric layers produced by the above techniques, capacitive coupling problems are not reduced to acceptable levels. That is, capacitive isolation between the substrate and components is not reduced to an acceptable level. The limited thickness of the dielectric layer prevents its use for transmission line applications. Additionally, many of these processes are incapable of forming a dielectric layer having a sufficiently high dielectric constant (e.g., at least 4.1 at 2 degrees C. and 1 MHz) and sufficiently low loss tangent (e.g., at most 0.06 percent at 20 degrees C. and 1 MHz) to permit use of the resulting board in high performance electronics applications (e.g. microwave and/or other radio frequency circuit applications (e.g. microwave and/or other radio frequency circuit applications).

Other techniques used conventionally in the fabrication of glass-on-silicon makes use of the bonding of a glass wafer to a silicon wafer. This process has certain advantages, for example the ability to maintain an acceptably thick layer of glass for transmission lines, as well as an acceptably thick layer of glass/silicon during processing to prevent cracking and thus improve yield. Unfortunately, these techniques require a circumferential lip to effectively bond the glass to the silicon. This technique renders, thereby, a portion of the wafer not useful. The techniques discussed herein can be found in U.S. patent application Ser. No. 08/845,726 to Boles, et al. and U.S. Pat. Nos. 5,268,310 and 5,343,070 to Goodrich, et al., the disclosures of which are specifically incorporated herein by reference. Additionally, discontinuities due to pockets or voids in the glass result in unacceptable dielectric properties and result in an unacceptable degradation in the electrical properties of the resultant heterolithic microwave integrated circuit. To this end, at a corner of a silicon pedestal there is a tendency for a void to form between the silicon and the glass. While the technique used to fabricate the HMIC structure the referenced application to Boles, et al., serves to reduce the voids to acceptable levels, the silicon structures forming the pedestals are limited to those formed by wet-etching techniques. To this end, the silicon is monocrystalline and is anisotropically etched to reveal crystalline planes. These planes enable the bonding of glass without significant voids. Vertical pedestals with substantially right angle corners can not be used due to the large air gaps and poor adhesion of the glass thereto. The presence of these air gaps both limits the size of the pedestals and forces a minimum spacing between pedestals. These factors reduce the number of die that can be fabricated on a wafer and reduces the number of chips that can be placed on a given substrate. Furthermore, the cost of the glass wafers are substantially higher than the cost of the silicon wafer and becomes prohibitively more expensive for wafer diameters larger than 100 mm.

Another technique for fabricating relatively thick layers of electronics grade glass on silicon substrates at lower cost is as disclosed in U.S. Pat. No. 5,639,325 to Stevens, et al. The patent to Stevens, et al., discusses the use of a slurry of glass powder which is prepared with a variety of solvents to include volatile organic solvents and/or water. Additionally, the use of hydrogen is discussed at an ambient temperature of 800° C. This reference to Stevens, et al., while having clear advantages when compared to other techniques for forming a glass layer on a silicon substrate and the article thereby produced compared to the prior techniques, there are certain drawbacks which are inherent in the Stevens, et al. technique. To this end, the reference to Stevens, et al., discloses the use of a particle size of the powder which has an average granular size of about 325 mesh. Particle size as well as variations in the size of the particles can be problematic. In many applications thin glass layers are required, on the order of 5.8 mils. For example, as is disclosed on U.S. patent application Ser. No. 08/845,726, to Boles et al. referenced above, it is necessary to backfill 5–8 mils of glass in thickness between silicon pedestals which are on the order of 3–4 mils in height. When particle size variation ranges in the order of 5–100 microns, it is difficult to effect this desired thickness without multiple firings. To this end, islands on the order of 1 mil can form on the relatively thin glass layer on the order of 0.5 microns which is formed in the first firing. The process must then be repeated to continually increase the thickness and make more uniform the regions between the islands. The reason that the islands are formed is due surface energy effects which occur when the powder starts to melt and due to the variation in size starts to melt into clumps. Accordingly, it is desirable to have a process to fabricate the relatively thick glass layer on the order of 4–12 mils in a variety of applications in a single firing. Another significant drawback to the technique disclosed in the Stevens, et al. patent, is the fact the hydrogen bubbles of a relatively large size remain in the glass as well, creating "pock" marks or craters. The technique disclosed in the reference to Stevens, et al., has clear advantages over prior techniques of forming glass, particularly in a slurry as the hydrogen bubbles are significantly reduced compared to the air bubbles that form and no firing under partial pressure of hydrogen is effected. However, these craters and bubbles have clear disadvantages in uniformity. The hydrogen bubbles can reduce the electronic performance because the glass is not as uniform of a dielectric as is required in electronics grade, particularly high frequency where capacitive coupling is a issue which must be attended to very carefully. Often, the thickness of the glass is reduced to an undesirable level in order to properly grind and polish the surface.

Accordingly, what is needed is a technique for fabricating structures for use in rf and microwave applications having a silicon substrate and a relatively thick and uniform glass layer, that do not suffer from the above described disadvantages of the techniques described above.

SUMMARY OF THE INVENTION

The present invention relates to a method of forming a glass layer on a substrate of material, preferably silicon, with the glass layer having a coefficient of thermal expansion which substantially matches that of the substrate. A powder or frit of the glass has a particle size of a very controlled dimension, preferably on the order of 19 microns, with a small standard deviation. This substantially reduces the tendency for island formation in the glass layer during firing.

The slurry is formed using isopropanol as the carrier. The surface tension of isopropanol enables the build up of the wet slurry by beading about the perimeter of the underlying wafer. This allows a sufficient amount of slurry to obtain a fired glass layer on the order of 200 microns or more up to 300 $\mu$m. In addition, reduced amounts of slurry can be applied to controllably realize thinner glass layers. In contrast, previous single firing techniques using other solvents have thicknesses on the order of 50 microns and thus require multiple slurry applications. This can result in variations of thicknesses and thus unacceptable products.

The firing of the slurry is effected at a significantly reduced temperature, on the order of 800° C., compared to prior techniques. This avoids the formation of silicides or other alloys from the metallized ground plane which is preferably Ti/Pt/Ag/Pt/Ti.

Finally, the firing sequence, both in terms of temperature, pressure, and atmosphere, results in not only a thick, uniform, glass layer but a substantially bubble-free one. It is exceedingly difficult to fabricate a substantially bubble-free layer of Corning 7070 glass at such a low temperature because the glass is still highly viscous at this temperature. The high viscosity makes it difficult for bubbles to rise through the glass and open at the top of the glass surface. The initial firing sequence is one of a slow heating to 450° C. in vacuum in order to remove residual isopropanol or adsorbed gases from the glass powder. At this point, either hydrogen or helium (preferably hydrogen) is introduced into the chamber to surround the unfired glass layer in at atmosphere on a gas which diffuses vary rapidly through porous bulk glass. As the glass powder melts into one uniform layer upon heating to 800° C., bubbles, form at the interstices between glass powder particles which are melting together. These bubbles are hereby filled with hydrogen or helium, which has a very high diffusion coefficient through glass due to their small molecular size. The article is surrounded in an ambient of either hydrogen or helium for the first hour at 800° C., to make sure that the glass completely melts and what bubbles do form are filled with hydrogen or helium. The glass is fired in a nitrogen ambient for the final one to four hours at 800° C. Changing the atmosphere minimizes the partial pressure of hydrogen or helium. During the firing in nitrogen the bubble size and number decrease as bubbles (1) rise to the top of the glass and break, or (2) dissolve into the glass, in the case of bubbles filled with hydrogen. To this end, introducing a partial pressure of nitrogen reduces the hydrogen partial pressure which provides a kinetic driving force to cause the escape of hydrogen bubbles from the glass as well as the reduction of hydrogen bubble size within the glass layer itself. In addition the surface roughness can be improved significantly by the use of the over pressure of nitrogen in order to facilitate the removal/reduction of size of hydrogen bubbles from the glass. By reducing the crater effect, the concerns surrounding machining the surface to a smoother/more uniform surface are eliminated, and thereby the potential to reduce the thickness of the glass layer to an unacceptable level is avoided. In addition, because the hydrogen bubbles which are left are of a reduced volume, because of the low partial pressure of hydrogen in the nitrogen atmosphere and because nitrogen has a low diffusivity in the glass, a more uniform dielectric material is realized in the thickness appropriate to reduce capacitive coupling to a suitable level. In addition, the top surface is smoother than if the glass is fabricated by techniques of the prior art.

By using the technique of the present invention a variety of advantages are realized. First, as mentioned above, prior techniques which fuse a glass wafer to a silicon wafer require a peripheral lip about the wafer to effect a good vacuum seal and thereby bond. This has a disadvantage in two ways. First, wafer "real estate" of the perimeter is rendered useless. In contrast, the process of the present disclosure enables practically the entire wafer to its perimeter to be used. Furthermore, during the prior vacuum fusion technique, the glass experiences expansion which requires a lower packing density of wafers in a furnace during firing. Because the frit technique of the present invention does not experience such an expansion, the wafers can be fired in larger quantity per firing. Finally, the pedestals can be manufactured by various techniques and with various shapes. To this end, in addition to the pyramidal shape of anisotropically (wet) etched monocrystalline silicon, vertical structures having nearly right angle corners can be fabricated. These can be fabricated by dry etching (to include reactive ion etching). The frit technique can then be utilized. In prior techniques (such as the fusion of glass to silicon) larger interfacial air gaps would form between the glass and silicon and the adhesion of the glass to silicon would be reduced if such "right angle" pedestals would be used. These air gaps would have deleterious effects on performance through non-uniformity in the dielectric properties of the material.

OBJECTS, FEATURES, AND ADVANTAGES

It is an object of the present invention to have a technique for fabricating electronics grade glass layers on substrates having a desired thickness and improved uniformity at substantially lower cost compared to the prior art.

It is a feature of the present invention to effect a two gas firing sequence, with the first gas of hydrogen or helium to effect diffusion of air bubbles out of the glass and a second over pressure of nitrogen to reduce the size and number of hydrogen or helium bubbles remaining.

It is an advantage of the present invention to form a layer of glass of a desired thickness in one firing with a variety of silicon substrate structures, as a result of the specific glass powder particle size distribution discussed herein.

DETAILED DESCRIPTION OF THE INVENTION

The preferred embodiment of the present disclosure is drawn to the preparation and disposition of a glass layer on a substrate. Preferably, this substrate is one of silicon, more preferably monocrystalline silicon. Alternatively, as will be described herein, polycrystalline silicon and amorphous-silicon can also be used. The contour or structure of the silicon can have pedestals, but also can be substantially planar. In the event that the structure has a substantially planar silicon substrate, metalization is disposed on top of the substrate, thereby between the substrate and the layer of glass. As the metalization technique is known, it will not be discussed in detail herein. To this end, the above captioned patent application to Stevens, et al., which is specifically incorporated by reference, teaches the preferred technique for metalization, particularly when the metalization is between the glass and silicon layers. Additionally, it is well known to one of ordinary skill in the art that components and transmission line structures are disposed on the top surface of the glass layer. Accordingly, as this is well known to one of ordinary skill in the art, the components disposed on the top as well as the methods of disposing them will not be discussed in detail. The components as well as the methods for disposing them on the top surface of the glass are those which would be known to one of ordinary skill in the art.

Figure 1A:
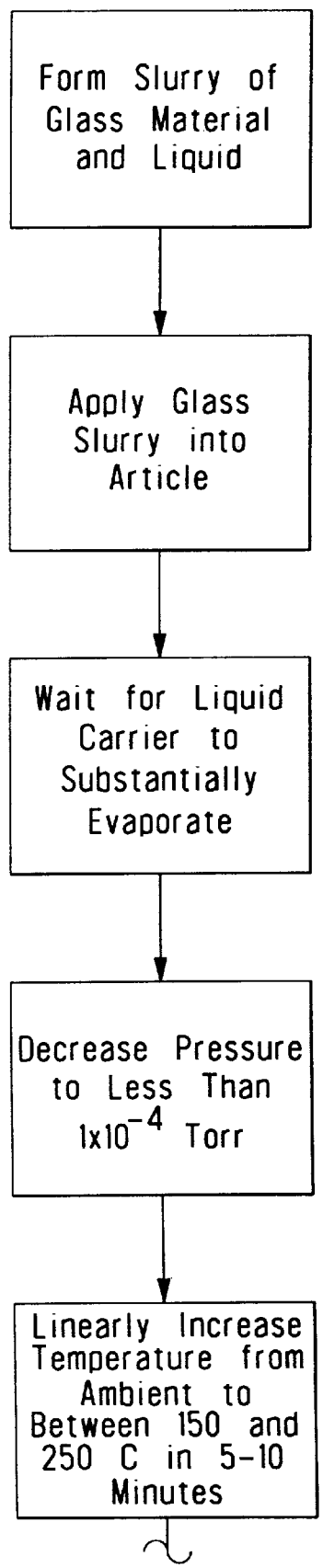
FIGS. 1a–1c is a flow chart showing the preferred process steps of the technique use to fabricate the glass layer of the present invention.

The first step in the process is preparation of the glass slurry. Preferably, the application of the glass materials is accomplished forming a slurry or paste of powdered (commonly known as frit) glass material in liquid. This is shown in FIG. 1A at block 1. The particle size distribution of the frit powder is of critical importance as has been described previously. The discovery of the particle size and particle size distribution and the effect thereof in eliminating the voids and discontinuities that plague prior art techniques for fabricating glass layers is that the mean particle size distribution should be between 15–25 microns, with no particles having a diameter greater than 100 microns. Additionally, it has been found that the distribution should contain a minimum number of fine particles with sub-micron size. Preferably, the slurry is composed of mass ratios of glass powder to liquid between 1:1 and 2.0:1. These ratios result in a slurry of sufficiently low enough viscosity to enable pouring the slurry onto the second adhesion layer (not shown). The slurry application method is preferably pouring, although other slurry applications well-known to practitioners of glass and ceramics processing, such as tape casting, screen printing, or spin coating, could be used. Additionally, the liquid is preferably isopropanol.

After preparation of the slurry, the slurry is poured on to the top surface of the second adhesion layer shown as block 2 The slurry is permitted to dry via evaporation of the liquid carrier (block 3). This process can be accelerated by elevating the temperature to accelerate evaporation of the solvent and minimize moisture adsorption.

Thereafter, the firing sequence is initiated. The firing sequence is conducted as follows. The pressure around the article is pumped down to a pressure preferably less than $1 \times 10^{-4}$ and at room temperature (block 4). This aids in the removal of any residual liquid or solvent. Thereafter, with the pressure approaching less than $10^{-4}$, the temperature is raised substantially linearly to 200° C. in a period of approximately five minutes. This tends to drive off any remaining liquid. The temperature is maintained at 200° C. for approximately five minutes. As can be seen from blocks 5 and 6 in FIG. 1B, it is possible to have a range in the temperature as well as in the time to increase the temperature. In contrast, the preferred technique as discussed herein is shown FIG. 2 in tabular form. The next step in the process requires the linear increase in temperature, maintaining vacuum ($1 \times 10^{-4}$ torr) which occurs in a period of less than fifteen minutes. This is shown in block 7. The final temperature is preferably 450° C. with an acceptable range of 400–500° C. at this step. The substrate and glass layer thereon are maintained at this temperature again preferably 450° C., and vacuum pressure of $1 \times 10^{-4}$ torr for preferably forty minutes with a preferred range of 30–45 minutes (block 8). This initial reduction in pressure and heating cycle are for the purpose of slowly heating the layer of glass to 450° C. in vacuum in order to remove any residual isopropanol or gases which have adhered from the glass powder. This initial sequence takes preferably 58 minutes. At this point, hydrogen preferably, or helium, is introduced into the chamber to permeate the unfired glass layer at a pressure of approximately 1 atmosphere (760 torr). The gas diffuses very rapidly through the bulk of the glass. As the glass powder melts into one uniform layer upon heating to 800° C., bubbles form at the interstices between glass powder particles which are melting together. These bubbles are filled with hydrogen or helium depending on which is used. Either of the gases have a very high diffusion coefficient through glass but to a very small molecular size. The introduction of hydrogen with the linear increase in temperature to preferably 800° C. is shown at block 9. This is effected in a period of less than 30 minutes.

Figure 1B:
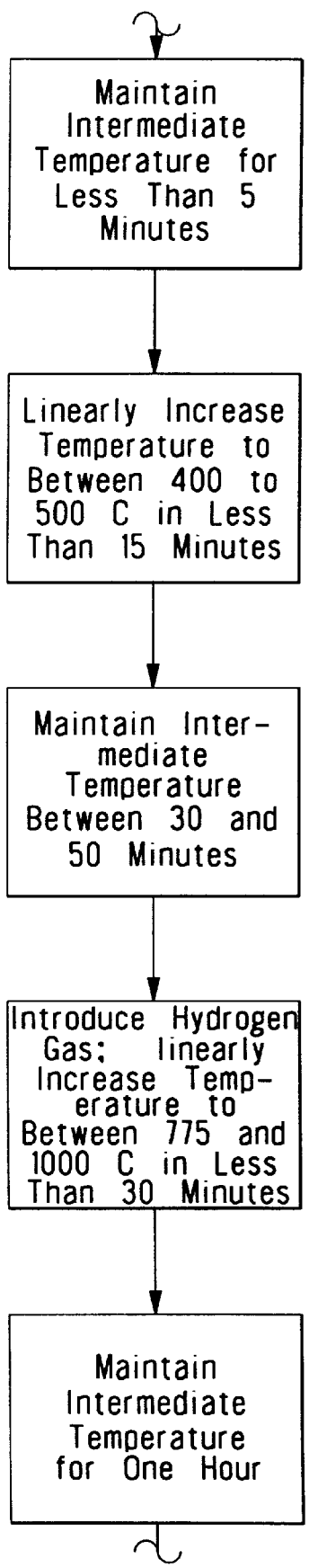

The glass/substrate article is maintained at the temperature of approximately 800° C. for a period of approximately one hour as is shown in block ten of FIG. 1B. Hydrogen gas is flowing for both the temperature and pressure as set forth in block 9 and for the one hour period. At the intermediate temperature shown at block 10 an ambient of hydrogen prior to and during the melting of the glass at the intermediate temperature fills the resulting bubbles in the glass with a gas that diffuses relatively quickly in the glass. Hydrogen diffuses quickly from the bubbles accelerating the rate of bubble shrinkage as well as removal of the bubbles from the glass.

Figure 1C:
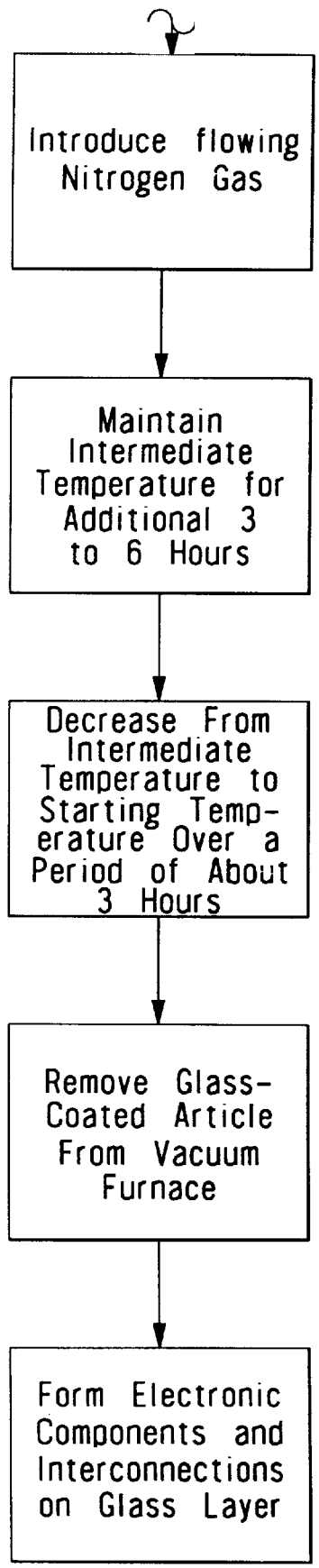
Figure 2:
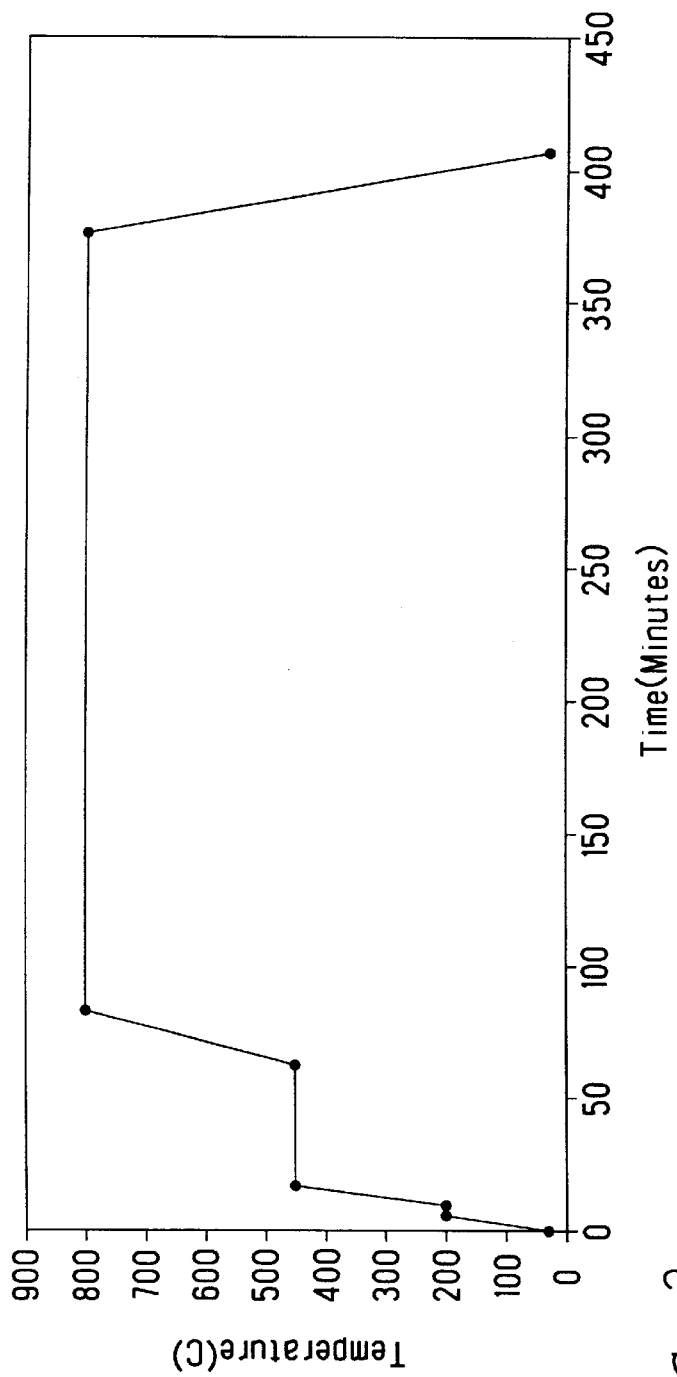
FIG. 2 is a tabular representation of the firing schedule to obtain the glass-coated article for electronics applications with a graphical representation of the firing schedule.

The next step in the process is the introduction of nitrogen gas which is shown at block 11 in FIG. 1C, as well as in tabular form and graphical form in FIG. 2. This is a significant improvement over prior techniques as has been discussed above. The introduction of nitrogen at a pressure slightly greater than 1 atmosphere is maintained for a period of approximately 2–6 hours (block 12). The introduction of nitrogen significantly decreases the partial pressure of hydrogen, establishing a concentration gradient that further enhances the removal of the hydrogen from the glass. The volume of the glass bubbles are filled with primarily hydrogen gas. The enclosed hydrogen has a tendency to diffuse into the surrounding void-free glass with a relatively lower hydrogen concentration. The glass particles melt and flow together shown at blocks 9, 10, 11, and 12. Thereafter, in a final stage which lasts preferably for 2–4 hours, the temperatures decrease from the intermediate temperature to the beginning or ambient temperature in a linear fashion (block 13). Again this is over a period of approximately 3 hours. By following this multiple stage process, substantially all air pockets, voids, deformities and surface roughness encountered in the prior art are eliminated out of the flowing glass, and the glass becomes more uniform and is bonded to the underlying article. Advantageously, in the embodiment in which the multiple layer metalization is used, the second adhesion material layer increases the ability of the glass to bond to the underlying article so that the problems of edge rollback and other non-uniformities are substantially eliminated. Again, this is as discussed in the above captioned reference to Stevens, et al.

It should be noted that other gases besides hydrogen can be used in the above captioned process. Other small-molecular diameter gases which have high diffusivities in glass, to include helium as well as others within the purview of the artisan of ordinary skill can be substituted for hydrogen in blocks 9 and 10 of FIG. 1B. Additionally, firing times of longer duration can be required to obtain a comparable glass article produced by firing in hydrogen. With bubbles filled with inert gases, bubble removal from glass occurs primarily through the floatation of gas-filled bubbles to the surface. Hydrogen, unlike other inert gases, can chemically integrate into the glass during firing enabling the bubbles to collapse via hydrogen absorption by the glass matrix in addition to the common bubble floatation mechanism operative with other enclosed gases. This is a very important vehicle in the process described above. Finally, it is important to note that while nitrogen is the preferred gas used to effect reduction in size and number of the bubbles in due to the reaction of hydrogen (or other suitable gas) via the reduction of its partial pressure, other gases can function in this capacity. To this end, due to its molecular size, nitrogen will not permeate the glass. Other gases with such characteristics could be used, to include for example Noble gases such as Ar, Kr, Xe as well as for example Oxygen. The important parameter is generally the diameter of the molecule or atom of the gas. This must be large enough without reacting chemically to the glass as can be appreciated by the artisan of ordinary skill.

Figure 3:
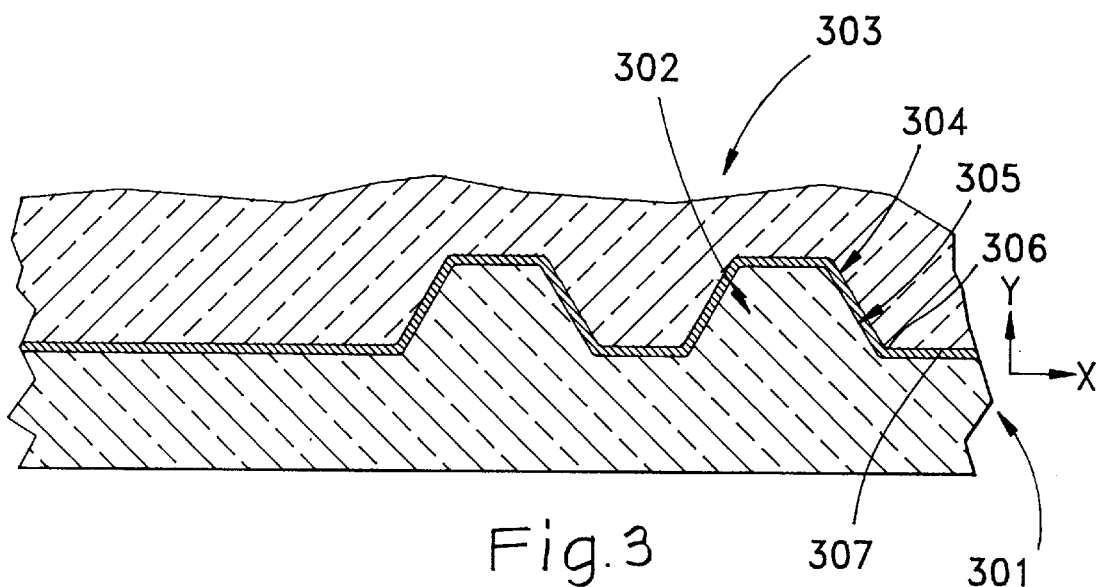
FIG. 3 is a cross-sectional view of a layer of glass on a silicon substrate having pedestals disposed therein.
Figure 4:
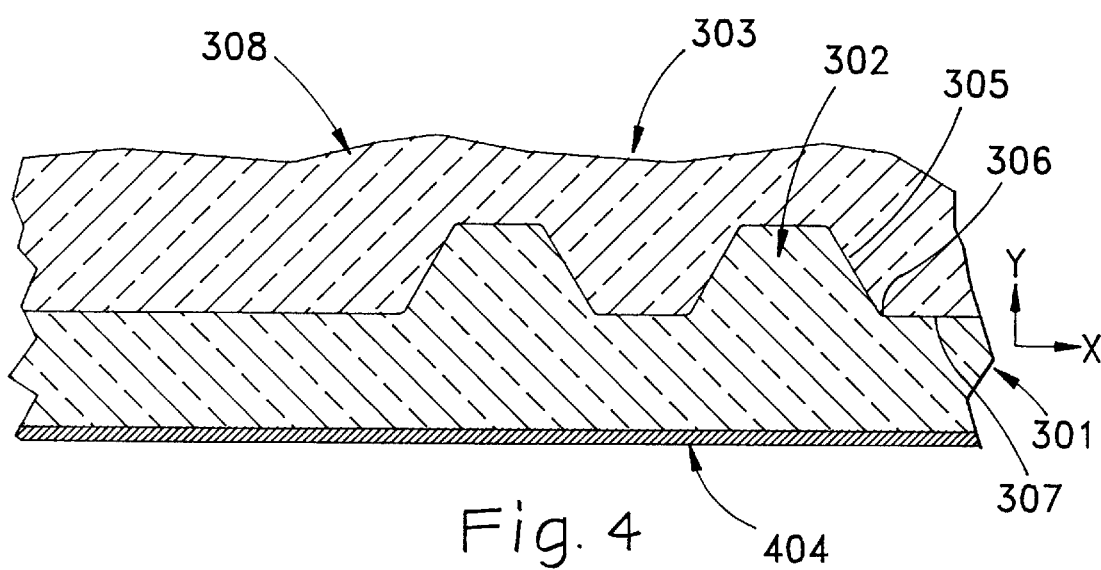
FIG. 4 is a cross-sectional view of the glass layer disposed on a silicon substrate having the ground plane on the bottom surface of the substrate.
Figure 5:
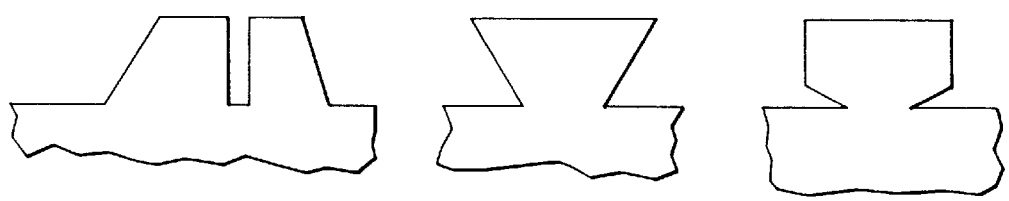
FIG. 5 shows exemplary shapes of pedestals that can be used with the invention of the present disclosure.

The articles are then cooled from the glass-melting temperature to ambient temperature as shown in block 14 (FIG. 1C). The desired thickness of the glass is effected through a mechanical grinding and polishing step, with subsequent fabrication of circuit elements, components and interconnections effected using conventional techniques as shown in block 15 of FIG. 1C. The intermediate products after the annealing step but prior to the mechanical grinding step are shown in FIGS. 3 and 4. FIG. 3 shows the substrate, again preferably of monocrystalline silicon to 301 with pedestals 302. The glass material 303 is disposed thereon. The pedestals are formed through a standard wet etching technique, as is discussed in the above captioned patent application to Boles, et al. A ground plane layer 304 is disposed on the between the glass and the silicon. Again, the pedestals serve various and sundry purposes within the purview to one of ordinary skill in the art. Again, the reference to Boles, et al. discloses various techniques for using the pedestals and electronic components as for example doping to form a proper connection to ground. FIG. 4 shows virtually the same structure as in FIG. 3 however with the ground plane shown at 404 disposed on bottom surface of the silicon. An alternative approach which is possible with the invention of the present disclosure would be one in which the pedestals rather than having the characteristic angle or angular sides, for example as shown at 305 with the transition to the flat surface shown at 306 would be one in which the pedestals have a much more vertical profile. That is the sides 305 would be orthogonal to the flat surface 307 of the silicon substrate. Such a shape or profile would not be possible with prior techniques, as voids would certainly form in the region 306. Additionally, poor adhesion is effected by prior techniques to dispose the glass material in a structure having a profile with a more vertical pedestal, again one in which the sides 305 are substantially perpendicular to the flat surface 307 of the silicon. Accordingly, such a structure can be effected through other etching techniques to include reactive ion etching (RIE) and others well known. Because of this, a variety of options are available to the artisan of ordinary skill in the use of the silicon pedestals. Furthermore, because monocrystalline materials are not required to effect the pedestals, etching can be effected on polysilicon as well as amorphous silicon as the artisan sees fit.

The invention having been described in detail, it was in the purview to one of ordinary skill in the art to modify the teachings of the present disclosure without departing from the theme and spirit of the invention. To the extent that variations and modifications are within the purview of artisan of ordinary skill having the benefit of the present disclosure, such modifications are deemed within the scope of the invention, an improved process for fabricating electronics grade glass on substrates having an improved uniformity due to the increase in removal of bubbles as well as a reduction in their in size through the process steps disclosed herein.

What is claimed is:

1. A process for fabricating a glass layer for use in integrated circuit, comprising the steps of:

providing a substrate having a slurry of powdered glass mixed with a liquid solvent disposed on a surface thereof;

within a firing chamber, establishing temperature and pressure conditions effective to aid in removal of residual solvent from said slurry to thereby obtain an unfired glass layer;

in a first gas introducing step, introducing a first gas having a sufficiently small molecular diameter as to permit diffusion into said unfired glass layer;

heating said glass layer to a temperature at which bubbles form in interstices between glass powder particles melting together, the gas introduced during said first gas introducing step filling the bubbles during the heating step;

maintaining said glass layer at a temperature and pressure such that at least some of the first gas within the bubbles formed during said heating step diffuses into void free areas of the glass layer;

in a second gas introducing step, introducing a second gas having a sufficiently large molecular diameter as to not diffuse into the glass layer and not react chemically therewith, said second gas being at a pressure effective to decrease a partial pressure of said first gas to thereby establish a concentration gradient which promotes further migration of said first gas into void free areas of the glass layer.

2. The process according to claim 1, wherein said first gas is one of hydrogen and helium, and wherein said second gas is nitrogen.

3. The process as recited in claim 1, wherein said glass powder comprises particles having a mean particle diameter distribution on the order of 15–25 microns.

4. The process as recited in claim 1, wherein said substrate is etched selectively to form pedestals prior to said application of said slurry.

5. The process as recited in claim 4, wherein said substrate is monocrystalline silicon and wherein said pedestals are etched in a wet etching process.

6. A process for fabricating an integrated circuit, comprising the steps of:

providing a substrate having a slurry of powdered glass mixed with a solvent disposed on a surface thereof, said slurry constituting an unfired glass layer;

in a first gas introducing step within a firing chamber, introducing a first gas having a sufficiently small molecular diameter as to permit diffusion into said unfired glass layer;

heating said unfired glass layer to a temperature at which bubbles form in interstices between glass powder particles melting together to thereby obtain an intermediate glass layer, the gas introduced during said first gas introducing step filling the bubbles during the heating step;

maintaining said intermediate glass layer at a temperature and pressure such that at least some of the first gas within the bubbles formed during said heating step diffuses into void free areas of the intermediate glass layer;

in a second gas introducing step, introducing a second gas having a sufficiently large molecular diameter as to not diffuse into the intermediate glass layer and not react chemically therewith, said second gas being at a temperature and pressure pressure effective to decrease a partial pressure of said first gas to thereby establish a concentration gradient which promotes further migration of said first gas into void free areas of the intermediate glass layer.

7. The process as recited in claim 6, wherein said first gas is one of hydrogen and helium.

8. The process as recited in claim 6, wherein said glass powder comprises particles having a mean particle diameter distribution on the order of 15–25 microns.

9. The process as recited in claim 8, wherein none of said particles have a diameter greater than 100 microns.

10. The process as recited in claim 6, wherein said solvent is a liquid and said glass powder and said liquid have a mass ratio of glass to powder to liquid of between 1 to 1 and 2 to 1.

11. The process as recited in claim 10, wherein prior to said first gas introducing step, temperature and pressure conditions are established in the firing chamber effective to aid in removal of residual solvent from said slurry to thereby obtain an unfired glass layer.

12. The process as recited in claim 6, wherein said substrate is etched selectively to form pedestals prior to said application of said slurry.

13. The process as recited in claim 12, wherein said substrate is monocrystalline silicon and wherein said pedestals are etched in a wet etching process.

14. The process as recited in claim 6, wherein said second gas is selected from the group consisting of nitrogen, argon, krypton, xenon, and oxygen.

15. The process as recited in claim 6, further including a step of cooling said intermediate glass layer after said second gas introducing step to thereby obtain a finished glass layer.

16. The process as recited in claim 15, further including a step of grinding and polishing said finished glass layer and a step of defining at least one integrated circuit device on said glass layer following said grinding and polishing step.

* * * * *